(12) United States Patent
Hubel

(10) Patent No.: US 6,695,961 B1
(45) Date of Patent: Feb. 24, 2004

(54) CARRIER SERVING TO SUPPLY CURRENT TO WORKPIECES OR COUNTER-ELECTRODES THAT ARE TO BE TREATED ELECTROLYTICALLY AND A METHOD FOR ELECTROLYTICALLY TREATING WORKPIECES

(75) Inventor: Egon Hubel, Feucht (DE)

(73) Assignee: Atotech Deutschland GmbH, Berlin (DE)

( * ) Notice: Subject to any disclaimer, the term of this patent is extended or adjusted under 35 U.S.C. 154(b) by 89 days.

(21) Appl. No.: 10/088,331

(22) PCT Filed: Sep. 13, 2000

(86) PCT No.: PCT/DE00/03220

§ 371 (c)(1),
(2), (4) Date: Feb. 25, 2002

(87) PCT Pub. No.: WO01/27358

PCT Pub. Date: Apr. 19, 2001

(30) Foreign Application Priority Data

Oct. 12, 1999 (DE) .......................................... 199 50 324
Feb. 15, 2000 (DE) .......................................... 100 07 799

(51) Int. Cl.⁷ ............................................. C25D 17/06
(52) U.S. Cl. ............. 205/80; 204/297.01; 204/297.06; 204/DIG. 7; 205/96; 205/145
(58) Field of Search ........................... 205/80, 96, 128, 205/145; 204/297.01, 297.06, DIG. 7

(56) References Cited

U.S. PATENT DOCUMENTS 4,752,371 A * 6/1988 Kreisel et al. ............ 204/297.1
5,024,732 A * 6/1991 Hubel ......................... 205/80
5,456,814 A * 10/1995 Metzka ................... 204/297.1
5,558,757 A * 9/1996 Hubel ......................... 205/96

FOREIGN PATENT DOCUMENTS

| DE | 29 51 708 C2 | 12/1979 |
| DE | 40 41 598 C1 | 12/1990 |
| DE | 42 05 659 C1 | 2/1992 |
| EP | 0 619 846 B1 | 12/1992 |
| EP | 0 308 636 B1 | 8/1998 |
| JP | 5-320994 | * 12/1993 |

* cited by examiner

Primary Examiner—Roy King
Assistant Examiner—William T. Leader
(74) Attorney, Agent, or Firm—Paul & Paul

(57) ABSTRACT

The invention relates to carriers serving to supply current to workpieces to be treated electrolytically or counter-electrodes and a method for the electrolytic treatment of workpieces. The carriers according to the invention comprise at least three elongate electric current conductors, disposed parallel to one another, a first current conductor being configured in such a way that the workpieces or counter-electrodes can, for supplying electric current or for mechanical attachment, be attached to the conductor directly or via holding devices, respectively a second to nth current conductor is provided, the second current conductor being connected to the first current conductor, the third current conductor to the second current conductor etc. via respectively at least one electrically conductive connection, in such a way that electric resistances existing between connections between the first and the second current conductor on the one hand and connections between the (n–1)th and the nth current conductor on the other hand are of the same size, and the nth current conductor is connected to the (n–1)th current conductor via an electrically conductive connection roughly in the centre of the (n–1)th current conductor and electric power leads are provided from a current source at at least one end of the nth current conductor.

16 Claims, 8 Drawing Sheets

PRIOR ART
FIG. 1
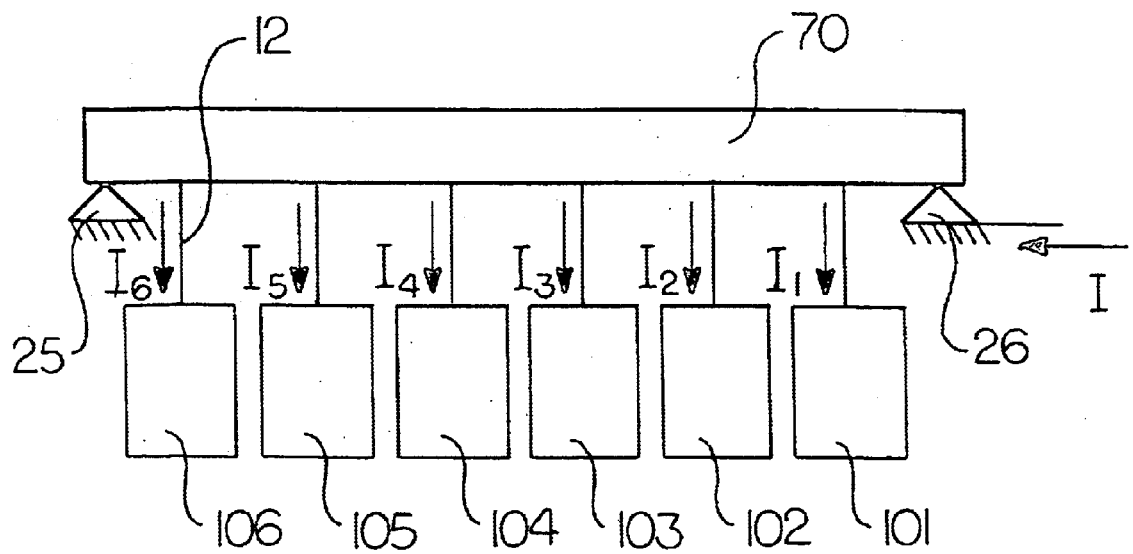
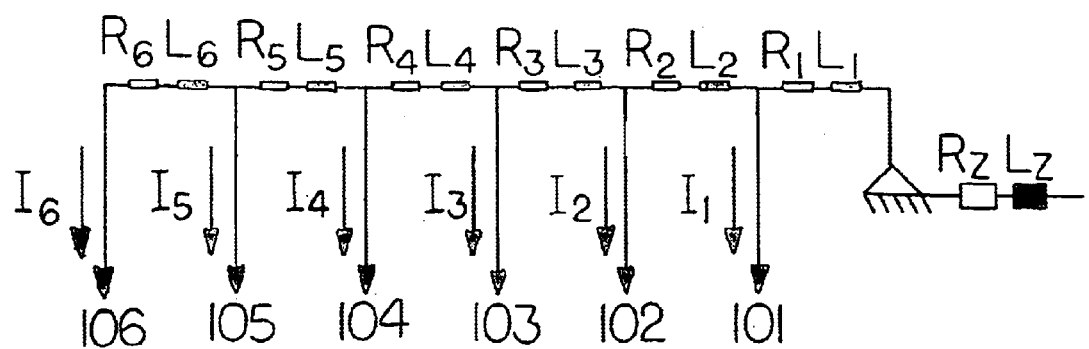

CARRIER SERVING TO SUPPLY CURRENT TO WORKPIECES OR COUNTER-ELECTRODES THAT ARE TO BE TREATED ELECTROLYTICALLY AND A METHOD FOR ELECTROLYTICALLY TREATING WORKPIECES

The invention relates to carriers serving to supply current to workpieces to be treated electrolytically or counter-electrodes and to a method for the electrolytic treatment of workpieces.

Workpieces to be treated electrolytically, for example printed circuit boards, are brought together with suitable counter-electrodes into contact with a treatment fluid. For electrolytic metallisation (electroplating) anodes are used as counter-electrodes. In conventional electrolytic treatment, the workpieces and counter-electrodes are dipped into a bath of the treatment fluid and a flow of electric current is generated by the workpieces and the counter-electrodes. In most cases, one counter-electrode is placed on each side opposite each workpiece, in order to be able to treat both sides of the workpiece.

The workpieces and the counter-electrodes are, for this purpose, secured to suitable carriers. Whilst the counter-electrodes are disposed stationary in a bath, the workpieces are secured detachable to elongate goods carriers and conveyed by means of conveying devices from bath to bath into the individual treatment stations. During electroplating, the workpieces are polarised cathodically during electrolysis and the counter-electrodes are polarised anodically. During electrolytic etching, cleaning, roughening and during other anodic processes (for example during electrophoretic processes), on the other hand, the workpieces are polarised anodically and the counter-electrodes cathodically. Solely the case of electroplating is described below in a representative manner. However the invention also relates to the cases in which the workpieces are polarised anodically and the counter-electrodes cathodically, or in reverse pulse plating are both polarised alternately anodically and cathodically.

Generally electrolytically deposited metal layers on workpieces have to be applied with a very uniform thickness. Mostly a large number of individual workpieces are secured to a goods carrier. In order to achieve uniform coating, all the workpieces must be exposed to substantially the same physical and chemical conditions during treatment. Here a very essential factor is the locally effective current density since this reacts proportionally to the amount of deposited metal. This means that substantially the same current density must be set at all the workpieces secured to a goods carrier. To this end, the same cell voltage must be applied to all the workpieces, i.e. the voltage measured between the surfaces of the individual workpieces and of the anodes facing the workpieces in the treatment bath must be the same for each workpiece.

In production plants, for example for treating printed circuit boards, the goods carriers and anode carriers bridge the relatively long treatment cells and are thus generally several meters long. The width of the so-called electroplating window (projection of the printed circuit boards, which are attached beside one another and in addition partially above one another to frames secured to the goods carriers) is thus very large. Through simultaneous electroplating of a large number of printed circuit boards it is possible to achieve high productivity of a plant. The whole electroplating current at a goods carrier must be set to very high values in plants of this kind in order to achieve a high current density at the printed circuit boards and thus short electroplating times. In particular, in very large plants in which also long goods carriers are used with a very large number of printed circuit boards attached thereto, the current required is very great.

Electroplating windows have a width of up to 8 m and a height of up to 1.5 m. The printed circuit boards are arranged in these plants very close together. The necessary current density at the printed circuit boards is for example 5 $A/dm^2$. If printed circuit boards are electrolytically copper-plated over their whole surface with direct current by means of such a system, on each side of a printed circuit board flows a current of 80 dm·15 dm·5 $A/dm^2$=6000 A. Since generally both sides of the printed circuit board are treated simultaneously, in this case a current of approximately 12,000 A flows. (This calculation does not take into account the fact that the through-bores present in the printed circuit boards have an additional surface.) In a high current of this kind, within the goods carriers a voltage drop occurs which cannot be disregarded, and which for the printed circuit boards secured in the vicinity of the location for current to be led into the goods carrier is low, and can assume very high values away from this location (for example several 100 mV) such that very different cell voltages occur for the individual printed circuit boards. Also at the anodes arranged opposite the printed circuit boards a non-negligible voltage drop can be noticed which occurs through the high current through the anode carrier. Therefore the mentioned objective or very even electroplating can only be achieved imperfectly.

When the reverse pulse technique (bipolar current pulse form) is used, even greater currents flow than quoted above. In this case the current is switched alternately cathodically and anodically during the treatment. In order to achieve a pre-determined electroplating result, the effective cathodic current intensity must be further increased in relation to the rated current intensity. Typically, during approximately 85% of the time electroplating is carried out and during roughly 15% of the time deplating takes place again. If the same amount of metal is to be deposited as during a direct-current treatment, the current intensity during the electroplating pulse phase must be increased by the amount which flows during the deplating phase. Instead of a current intensity in the previously described example of 6000 A or 12,000 A (using direct current) in this case a current intensity of 6900 A or 13,800 A must be set.

In EP 0 619 846 B1 is described that through the voltage drop at the goods carrier individual partial electrolytic cells are formed in addition between the respective edges of adjacent printed circuit boards in that a voltage drop occurs between the securing points of the printed circuit boards. From the edge regions, lying opposite one another and separated by a spacing, of two adjacent printed circuit boards, some act as a local anode and the others as a local cathode with a cell voltage. This leads to the partially cathodically polarised edge regions being more strongly metallised than the adjacent partially anodically polarised edge regions. When measured, as a result of this effect layer thickness differences of 20% and more were found.

In the past there has been an attempt to avoid these disadvantages by the following measures:

In EP 0 110 846 B1 has been described that the voltage drop at the cathode bars (goods carriers) and supporting rods of the frames holding the printed circuit hoards and at the anode carriers can be reduced by a reduction in the overall current, by increasing the electrical conductivity of the metal of the bars and the frame supporting rods and/or by increasing the cross-sections of the bars and frame supporting rods. However reference was also made to the fact that with a reduction of the current density, the electroplating times have to be lengthened, such that this measure works against the economic efficiency of an electroplating plant. An improvement in the electrical conductivity of the materials could be achieved by the use of copper instead of the stainless steel usually used. However in electroplating plants copper tends to severe corrosion, such that at both the anode and printed circuit board contacts additional and uncontrolled voltage drops occur. Stainless steel, which admittedly has a roughly 40 times lower electrical conductivity, is therefore preferred. Increasing the cross-section of the current-supplying structural elements is generally not possible to any extent and in particular with stainless steel on account of its high specific weight. Moreover very high material costs would thereby occur. A further measure for eliminating the disadvantages mentioned can, according to what is said in this printed publication, also basically be seen in feeding the current into the goods and anode bars from both ends. This admittedly reduces the voltage drops at the bars by half, but simultaneously also introduces new uncertainties, since the current is supplied at the contact points into the bars to the goods to be electroplated via detachable contacts. Through contamination and corrosion, electrical resistances which are of differing height form at these contact points. Via contact points with a low resistance, therefore, a greater current flows such that this contact can possibly fail completely because of overheating. Moreover with a failure of one of the two detachable contacts there is an acute danger of the cable from the current source to the bath burning through overload of the conductor cross-section on the contact side which is still intact. Because of this danger, the current conductors are generally dimensioned for the rectifier rated current, although in uninterrupted operation only 50% of the rated current flows on each side. Disadvantageous in this case, however, are the costs to be applied and the space required for this layout of the current conductors.

Because of these disadvantages, it is proposed in the publication mentioned that the current be fed into the goods carrier from the one side and into the anode carrier from the other side, and that the location where the current is supplied at least into the cathode bar and/or the cathodic frame supporting rods should be changed at least once during the electrolytic treatment of the printed circuit boards. By this means, in particular, large layer thickness differences in the edge regions of adjacent printed circuit boards are avoided without disadvantageous outlay to reduce the voltage drop in the cathode bar or the frame supporting rods having to be undertaken.

A further solution for the above-mentioned problems is proposed in DE 29 51 708 C2. The device disclosed there serves to regulate automatically partial current intensities of a rectifier for a galvanic bath, it being possible for the regulating system to affect both cathode currents and anode currents and also the simultaneous regulation of both. For this purpose, the regulating system contains for each partial current circuit a precision resistor which is located in a reference current circuit selected at random from the partial current circuits and is paired with each of the remaining precision resistors via differential amplifiers. The outputs of the differential amplifiers are connected to the bases of control transistors which are located in all the partial current circuits with the exception of the reference current circuit, however the reference current circuit contains a protective resistor which has the same resistance value as the control transistors in the middle of the regulating range. The current intensities at the individual workpieces are in this case respectively individually adjusted by a control circuit. With this automatic regulation, different current densities at the individual workpieces are largely prevented. What is disadvantageous in this method, however, is the considerable outlay on equipment in order to realise the individual electric circuits and the control circuits.

Another solution for adjusting the partial currents in order to improve the layer thickness distribution is described in EP 0 308 636 B1. To this end, passive, non-adjustable protective resistors are introduced in series to the technologically determined electrolytic resistances of the partial current circuits of the total electrolytic circuit, the size of the partial currents in the series circuit thus formed being determined by the protective resistors. This solution is admittedly cheaper than the wiring described in DE 29 51 708 C2. However the incomplete equality of the partial currents is particularly not acceptable if the additional power loss caused by the protective resistors is kept small. Otherwise a very high power loss occurs at the protective resistors such that the energy consumption is correspondingly increased.

In DE 40 41 598 C1 is described a further solution for adjusting the cell voltages for each part on the goods carrier. In the arrangement disclosed there which has two anode bars and one cathode bar, the cathode bar is brought into contact with the power leads at one side of the bath container and the anode bars at the other side of the bath container. In addition it is proposed that the cross-sections of the two anode bars be selected to be the same size and the ratio of the cross-section of the cathode bar to the cross-section of each individual anode bar be set at least as 1.7:1.0 or larger. But this solution is also disadvantageous for the above-mentioned reasons.

In addition to the problems described above (voltage drop at the goods carrier and at the anode carriers), when pulse technology is used in which the current at the printed circuit boards is very quickly poled in and out or reverse-poled, a further problem arises: it is required that a very quick rise in current is achieved. Generally current rise times of at the most 100 µs per 1000 A are required. In dipping plants, the pulse amplitudes are up to 7000 A for an anode carrier. At the goods carrier, in the usual configurations with anodes arranged on both sides of the printed circuit boards, therefore, pulse amplitudes of up to 14,000 A occur. Predominantly a pulse rise time of less than 0.25 ms is aimed at. Even if the inductances of the power leads, goods carriers and anode carriers are really small, they have a clearly effective inductance L for high current alteration speeds of this kind. The time constant τ (Tau) for an electric circuit acting inductively arises from $$\tau = L/R,$$

wherein R and L are the ohmic and inductive resistances of the total circuit. Small time constants T for the current rise require small inductive resistances.

To explain the conditions in an electroplating plant operated with pulse technology, reference is made to FIG. 1. In the upper part of this diagram are represented schematically the goods carrier 70 and six printed circuit boards secured to the goods carrier, represented with the reference numerals 101, 102, 103, 104, 105 and 106. The printed circuit boards are supplied with current via contact/attachment points 12. The goods carrier is placed on goods carrier receivers 25 and 26 which are secured to the edge (not shown) of the container containing the treatment fluid. The goods carrier is supplied with current I via the goods carrier receiver 26. The currents $I_1$, $I_2$, $I_3$, $I_4$, $I_5$ and $I_6$ flowing to the individual printed circuit boards 101 to 106 are also shown.

In the lower part of FIG. 1 is reproduced a simplified equivalent circuit diagram for this arrangement. Corresponding with each partial section on the goods carrier, through which the electroplating current flows to a specific printed circuit board $10_i$, is an additional ohmic resistance increment $R_1$ and an inductive resistance increment $L_i$. In addition, for all the printed circuit boards the common ohmic resistance $R_z$ and the inductive resistance $L_z$ of the power supply are effective outside the actual electroplating region.

The ohmic resistances $R_1$, $R_2$, $R_3$, $R_4$, $R_5$, and $R_6$ and the inductive resistances $L_1$, $L_2$, $L_3$, $L_4$, $L_5$ and $L_6$ in the individual goods carrier sections are added together. For printed circuit board 106, for example, all the ohmic resistances $R_1$ to $R_6$ and all the inductances $L_1$ to $L_6$, are effective, whilst only the ohmic resistance $R_1$ and the inductive resistance $L_1$ have an effect on the current rise time at the printed circuit board 101 in the region of the goods carrier up to the contacting of this printed circuit board. In practice, when the pulse current is fed in this way into the goods carrier, therefore, a noticeably higher current rise time is observed at the printed circuit boards which are arranged remote from the location for supplying current than in those which are contacted close to the location for supplying current. According to the configuration of the goods carrier and the arrangement of the printed circuit boards, an increase by a factor of up to 3 is observed.

The differences arising for the individual printed circuit boards are very disadvantageous since the electroplating result is substantially dependent on the pulse form of the electroplating current. Since in the arrangement shown, different time constants $\tau$ for the printed circuit boards are maintained, there arise therefore for the electroplating results considerable fluctuations which are to be avoided as far as possible. Moreover the pulse edges should run as steeply as possible during electroplating.

In order to balance the differences of the electroplating results and to keep the current rise times as low as possible, the pulse current is therefore preferably fed from both goods carrier receivers 25 and 26. Thus the differences which occur through the ohmic and inductive resistances $R_i$ and $L_i$ in the goods carrier are halved. What is disadvantageous, however, is that the problems connected with supplying current from both sides occur such as have been described above. These are in particular the increased outlay and space requirement for the stronger power supply cables or—if no strengthened cables are used—the increased risk of fire in the case of a defect or a greater increase in the resistance at one of the contacts at the location for supplying current to the goods carrier, furthermore the additional outlay for leading the cable from the pulse rectifier appliance to the opposite side of the bath container. Moreover the power leads, which are generally of double thickness, are laid on each cathode side for the same length up to the pulse generator in order to achieve further evening out of the ohmic and inductive resistances to one location or another for supplying current to the goods carrier. With this measure, too, considerable costs arise.

The above-mentioned remarks on the disadvantages of the known systems also refer to the disadvantages arising from the ohmic and inductive resistances at the goods carriers. In the same way, ohmic and inductive resistances are also effective at the anode bars such that the height of the individual resistances effective for the electroplating of the individual printed circuit boards, and their differing values for the individual printed circuit boards are further increased in relation to the above observation.

The problem underlying the present invention, therefore, is to avoid the disadvantages of the known systems and methods and in particular to find suitable means for achieving an electrolytic treatment of the workpieces which is as uniform as possible. These means should also guarantee that the treatment leads to a low fluctuation range of the treatment results not only when direct current is used but also when pulse methods are used. When pulse methods are used, for the pulse currents flowing in all the workpieces a very small and uniform time constant $\tau$ should be effective, for example in a range of below $\tau=1$ ms.

This problem is solved by suitable carriers according to claim 1, serving to supply current to the workpieces to be treated electrolytically or counter-electrodes, a combination of these carriers with additional carriers according to claim 13, and the method according to claim 14. Preferred embodiments of the invention are quoted in the subordinate claims.

The carriers according to the invention comprise at least three elongate electric current conductors, disposed parallel to one another, wherein a. a first current conductor is configured in such a way that the workpieces or counter-electrodes can, for supplying electric current and for mechanical attachment, be attached to the conductor directly or via holding devices, b. respectively a second to nth current conductor is provided, the second current conductor being connected to the first current conductor, the third current conductor to the second current conductor etc. via respectively at least one electrically conductive connection, in such a way that i. electrical transition resistances existing between connections between the first and the second current conductor on the one hand, and connections between the (n–1)th and the nth current conductor on the other hand, are substantially of the same size or exactly of the same size and ii. the nth current conductor is connected to the (n–1)th current conductor via an electrically conductive connection roughly in the middle of the (n–1)th current conductor and c. electric power leads are provided from a current source at at least one end of the nth current conductor.

With the carrier according to the invention, as large as possible an edge steepness of the current pulses during pulsed operation is achieved, since the proportion of parasitic inductances is reduced to a very small value.

With pulsed operation, just as important as the edge steepness is the uniform pulse form and pulse amplitude at each location of the carrier and thus at each workpiece. This is achieved with the selected carrier structure with a central feeding of the current from the nth into the (n–1)th current conductor and preferably feeding on both sides from the second into the first current conductor through the creation of balanced ratios for the current flow in the carrier, simultaneously feeding on both sides of the current from the current source via contact points into the carrier being avoided and the advantages connected with single-sided feeding being exploited:

low outlay and thus low costs in preparing the power supply cables, no problems with monitoring the electrical contacting at the receiving points for the goods carrier at the edge of the container; an increase in the transition resistance through corrosion or contamination of these contacts can be detected through the rise of the voltage there; the danger of the cables burning can thus be avoided; a cross-section overload of the cables for supplying the current cannot occur.

With the setting of balanced ratios for the current flow in the carrier, automatically cell voltages of approximately the same size are set and approximately uniform pulses at all workpieces, since the ohmic resistances and the inductances of the conductor sections are compensated in the current conductors by central feeding in the other direction. Through this measure, the pulse form and the pulse amplitude are approximately the same at all locations. Moreover this arrangement permits, when pulse technology is used, twisting of the high-current cables to compensate the line inductance up to the high-current contacts both of the carrier for the workpieces and of the carrier for the counter-electrodes. In practice, the spacing of the locations for the power supply to the goods carrier and the corresponding counter-electrodes carriers is generally roughly 250 mm. With a conventional structure of the carriers with feeding on both sides, this spacing would increase at least to the length of the carriers, i.e. to several meters.

When pulse technology is used, the connections, disposed centrally as described, between the adjacent current conductors can also be somewhat offset from the location of the power supply for the whole carrier, for example by 25% in relation to the total length of the carrier. Thus an optimal uniformity of the pulse form at all workpieces is achieved. With direct current operation, this central offset is not necessary.

In a preferred embodiment, three elongate electric current conductors can be provided disposed parallel to one another, the second current conductor being connected to the first current conductor via electrically conductive connections roughly at the respective two ends of the first current conductor, and the third current conductor being connected to the second current conductor via an electrically conductive connection roughly in the centre of the second current conductor. Electric power leads are provided in this case at at least one end of the third current conductor. These electrical connections have unavoidable transition resistances which should be the same size for reasons of symmetry.

In another preferred embodiment, the carrier comprises exclusively a first and a second electric current conductor, the two current conductors being elongate and disposed parallel to one another. The first current conductor is here configured in such a way that the workpieces or counter electrodes can, for supplying electric current and for mechanical attachment, be attached to the conductor directly or via holding devices. The second current conductor is connected to the first current conductor via electrically conductive connections roughly in the centre of the first current conductor. Electric power leads from the current source are provided at at least one end of the second current conductor.

The current conductors are preferably configured as conductor rails formed from electrically conductive material and consist in particular of metal. Thus a stable structure for mounting the generally very heavy workpieces and counter-electrodes on the carriers is achieved and in particular a low resistivity in the current conductors of the carriers is achieved by a large conduction cross-section. Naturally individual current conductors can also be configured in the form of cables, particularly the nth current conductor and especially if the carrier is provided for the counter-electrode.

In this case, a fixed connection before the current source can be formed by means of cables approximately in the centre of the adjacent carrier.

In a particularly preferred embodiment, the carrier according to the invention includes a first, a second and a third conductor rail. In this case, the first conductor rail is configured in such a way that the workpieces or counter-electrodes can, for supplying electric current and for mechanical attachment, be attached Go the rail directly or via the holding devices. The second conductor rail is connected to the first via electrically conductive connections roughly at the respective ends of the first and second conductor rails, and the third conductor rail is connected to the second via an electrically conductive connection roughly in the middle of the second conductor rail. In particular the third rail can if necessary also be replaced by a cable, preferably if the carrier is used to hold the counter-electrodes. In this case, the cable is preferably secured with one of its ends at the connection to the second rail. If the third current conductor is a rail, the electrical connection between this and the second rail is formed roughly in the centre of the third rail. At at least one end of the third conductor rail are provided electric power leads from a current source. To increase the stability of the carriers, in addition to the electrically conductive connections, electrically non-conductive (insulating) connections can be provided.

Through this very simple arrangement with three conductor rails, the effective ohmic and inductive resistance in the carrier is reduced to a minimum, such that the edge steepness and amplitudes of the pulses in the workpieces have optimally small differences.

The carrier can also be constructed from at least two current conductors: the second conductor rail is then connected to the first conductor rail via electrically conductive connections roughly in the centre of the first and the second conductor rails. Electric power leads from the current source are in this case provided at at least one end of the second conductor rail.

With this further construction according to the invention of the carrier, a balanced current distribution is made possible in the carrier, such that largely uniform ratios occur at all workpieces.

A particularly inexpensive embodiment of the invention can be used if the anodes can remain fixed in the bath. This is given for example when insoluble anodes are used or if the anode material is automatically filled into titanium baskets via corresponding supply devices. In this variant, the cables or rails coming from the current source can be screwed on directly roughly in the centre of the anode bars.

The conductor rails of the carriers are preferably configured in the form of flat sections, which are separated from one another by electrical insulation in the regions outside the conductive connections at which no connections are provided. The electrical connections can in this case be formed by a joining process. With this structure, the carriers according to the invention can be manufactured very simply, for example by laying flat sections on top of one another interspersed with insulating layers, for example formed from plastics material. The plastics material layers are preferably very thin, for example 2 mm, in order to minimise the effect of parasitic inductances. The individual rails are preferably connected to one another for example by a welding, friction-welding or soldering method, or by screws or rivets, the electrical connections being produced at these locations.

In an alternative embodiment, the conductor rails can also be cut to shape from a piece of electrically conductive material, for example by water-jet cutting.

Preferably the two or three conductor rails of a carrier are substantially of the same length and are disposed with corresponding lateral faces lying closely beside one another. The nth conductor rail can in particular be configured in such a way that it serves the mechanical fixing of the carrier to a bath container and can thus be configured somewhat longer than the remaining rails. For example bearing surfaces and electrical contact surfaces can be provided on this conductor rail which correspond to corresponding receiving points on the tank edge of a container on which the goods carrier is placed or to which the counter-electrodes carrier is secured.

For use in electrolytic treatment stations, the carriers according to the invention for holding and electrically contacting the workpieces and a conventional counter-electrode holder can be used. Alternatively, a carrier according to the invention can also be used for holding and electrically contacting the counter-electrodes and a conventional goods carrier for holding and electrically contacting the workpieces. Particularly advantageous is a combination according to the invention of at least one first carrier according to the invention, comprising three current conductors, with at least one second carrier, the second carrier comprising at least two current conductors, of which a. at least one first current conductor is configured in such a way that the workpieces or counter-electrodes can, for supplying electric current and for mechanical attachment, be attached to the conductor directly or via holding devices, b. at least one second current conductor is connected to the at least one first current conductor via an electrically conductive connection roughly in the centre of the at least one first and second current conductors and c. electric power leads are provided from the current source at at least one end of the second current conductor.

With the embodiment mentioned last, a particularly favourable arrangement is achieved: by the current in the first carrier being fed from the ends into the second or third rail, to which the workpieces or counter-electrode s are fastened and electrically contacted, and being fed in the second carrier from the centre, a further evening is achieved, by the partially differing length of the current paths, in relation to the attachment points for the goods to be treated and the counter-electrodes being compensated to a higher degree.

The method according to the invention for the electrolytic treatment of workpieces includes the following method steps:

a. The workpieces are secured to a first carrier according to the invention, preferably comprising three conductor rails.

b. The counter-electrodes are secured to at least one second carrier according to the invention, preferably comprising two conductor rails.

c. The carriers for the workpieces and the carriers for the counter-electrodes are placed on the tank edge of a container for a treatment fluid.

d. The workpieces and the counter-electrodes are here dipped into a treatment fluid.

e. Electric current generated from a current source, preferably electric pulsating current, is led via electric power leads on the carriers to the workpieces and the counter-electrodes.

BRIEF DESCRIPTION OF THE DRAWINGS

For more detailed explanation of the invention, reference is made to the figures described below. These show:

FIG. 1 a schematic representation of a carrier arrangement according to the prior art and simplified equivalent circuit diagram for this arrangement.

In FIG. 2a and FIG. 2b two embodiments of carriers according to the invention are represented in side view. For example the three-ply carrier 1 (FIG. 2b) can serve to mount workpieces and supply electric current to same, and the carrier 2 (FIG. 2a) can serve to mount anodes and supply electric current to same. Naturally the carriers can also be used in the anodic treatment of workpieces, such that in this case the carrier 2 serves to mount cathodes and supply electric current to same. Furthermore, the three-ply carrier can also be used to receive the counter-electrodes, and the two-ply carrier to receive the workpieces. The two carriers are combined with one another in an electrolytic cell and arranged there facing one another. In this case, for treating the workpieces on both sides, a second carrier 2 is also associated with the carrier 1 on the side, facing away from carrier 2, of carrier 1. The two individual carriers can also be combined in the electrolytic cell with conventional carriers or with other carriers according to the invention.

Figure 2:
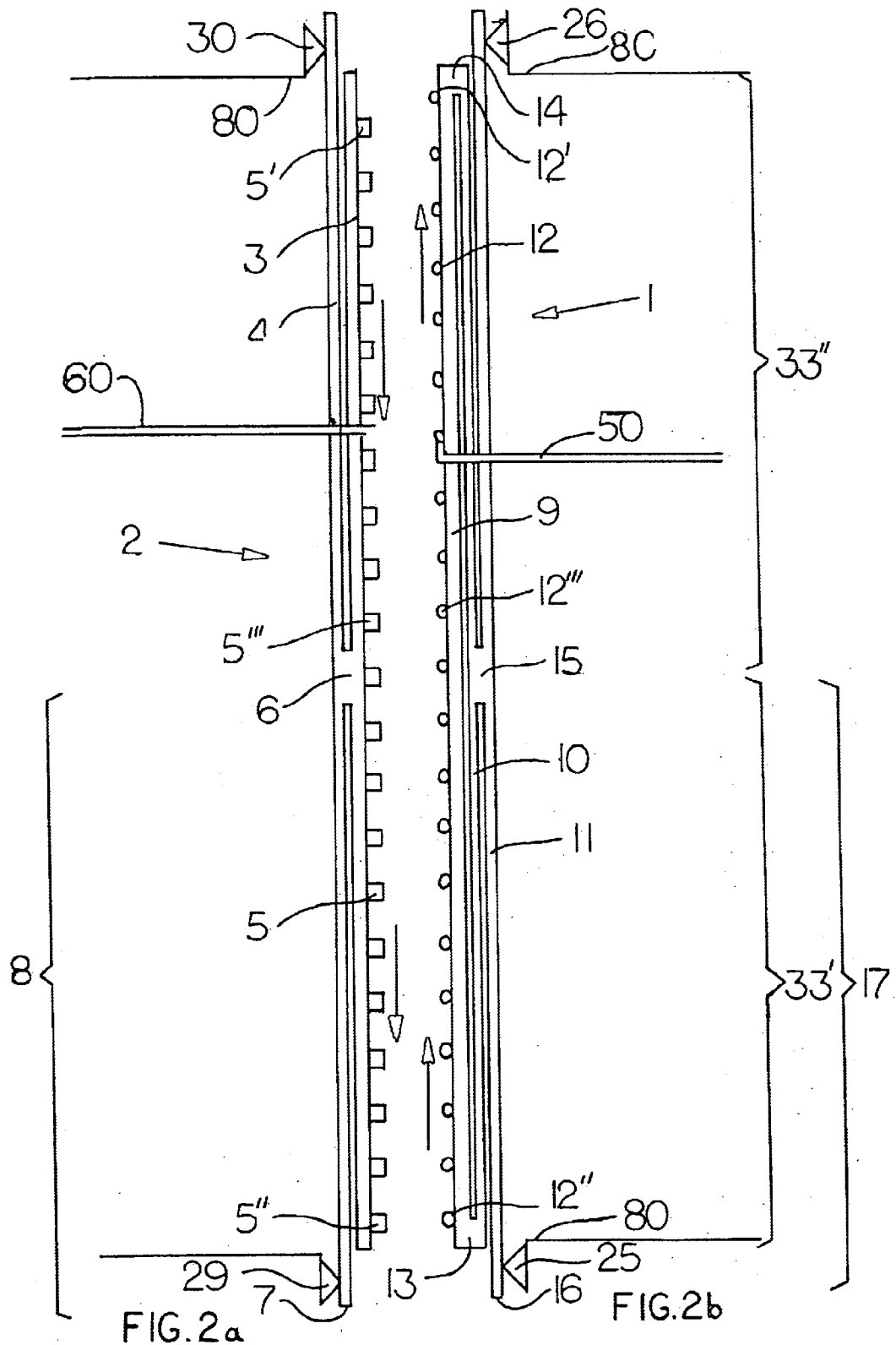
FIG. 2a a schematic representation of a two-ply carrier according to the invention for the workpieces and the anodes, in side view.
FIG. 2b a schematic representation of a three-ply carrier according to the invention for the workpieces and the anodes, in side view.

The two-ply carrier 2 has a conductor rail 3 and a conductor rail 4 which are disposed the one above the other. The conductor rails 3 and 4 consist for example of copper or of stainless steel, possibly with a copper core and are configured as flat sections, for example with a cross-section of 100 mm×20 mm.

The conductor rail 3 of carrier 2 serves to mechanically secure the anodes via anode suspensions 60 to the attachment points 5. The electric current is also led to the anodes via the attachment points.

Rail 3 is connected to rail 4 via connection 6 in such a way that an electrically conductive connection is formed at this location. A cross-section through the rail arrangement is reproduced in FIG. 12. The carrier 2 can be produced for example by laying two flat metal sections the one above the other with plastics material strips arranged between same for electrically insulating the rails from one another and screwing the rails to the electrical connection. To increase the mechanical strength, further screw connections can be present which are electrically insulated from the rails 3 and 4, in order not to produce any additional contact points.

Rail 4 is connected via an external electric current conductor to an external current supply, (both not shown). For this purpose, an electrical contact to the external current conductor is produced at location 7 at one end of rail 4, at which the carrier 2 also sits on the goods carrier receiver 29 on the edge of the container. The carrier sits at the other end also on a carrier receiver 30 on the container edge 80. The electrical contact can be formed for example by screwing the power-supply cable to the rail at this location 7. Should the carrier have to be transported in the plant, guides for the carrier on the edge of the container are inserted onto which the carrier can be placed.

In practical operation, the electric current I flows first via region 8 of rail 4 up to connection 6, from there via the connection to rail 3 and from the latter to the electrical contacting and attachment points 5 for the anodes. By connection 6 being disposed roughly in the centre of rail 3, a roughly symmetrical distribution of the individual cell voltages is produced for the anodes. The anodes secured in the outer region at the attachment points 5' and 5" here naturally experience a greater voltage drop through the flow of current in rail 3 than the anodes secured roughly in the centre of the rail in the vicinity of attachment point 5'''. However the voltage drop is the same for the two anodes secured at attachment points 5' and 5". Moreover the difference in the voltage drops between the anodes secured at attachment points 5' and 5" and those secured at attachment point 5''' is relatively small (half as much as with carriers according to prior art). Thus at the anodes very uniform ratios arise. In particular in combination with the second carrier according to FIG. 2b, the same electrical conditions occur at all workpieces.

If the carrier 2 is used in the application of a pulse method, inductances act in the individual current conductors. The inductive resistances corresponding to the inductances behave just like the ohmic resistances (addition of inductive resistances connected in series). Therefore the above observation is also true of inductive resistances.

The three-ply carrier 1 shown in FIG. 2b comprises rail 9, rail 10 and rail 11, which are arranged the one above the other. Rail 9 serves the mechanical attachment of the workpieces via frame rods at the attachment points 12. Moreover electric current is supplied to the workpieces via these attachment points. Rail 9 is connected to rail 10 via electrical connections 13 and 14 laid at the ends of the two rails. The additional rail 11 is disposed parallel to the two rails 9 and 10 and is connected to rail 10 at connection 15 situated approximately in the centre.

Rails 9, 10 and 11 of carrier 1 also consist of copper or stainless steel and can be configured as flat sections. To produce this carrier, the individual rails can be stacked first on top of one another with insulating layers, for example formed from plastics material strips, between the layers, and the three rails then connected to the connections 13, 14 and 15 in such a way that electrical connections are formed at these locations. To this end, the rails can again be connected to one another by screws, but also by rivets, by welding or by soldering. In an alternative method, the carrier can also be produced from a monolithic piece of metal by cutting to shape. For example the spaces between the rails can be formed by water-jet cutting, so that the carrier can be manufactured from one piece.

In operation, current is led via external current conductors at location 16 into rail 11, on which the carrier 1 also sits on the goods carrier receiver 25 at the edge 80 of the container. The carrier sits at the other end also on a carrier receiver 26 on the edge of the container. The current flows via region 17 of rail 11 to the electrical connection 15 and from there into rail 10. Then the current can flow via both regions 33' and 33" to connections 13 and 14 and from there into rail 9.

Through this special power supply, the workpieces situated in the vicinity of the attachment points 12' and 12" are treated in the same way since the voltage drop from the current source up to these locations is the same. The voltage drop in rail 9, on the other hand, is somewhat greater for the attachment point 12''' roughly in the centre of rail 9 than the voltage drop up to locations 12' and 12". This difference is relatively small however.

A particularly advantageous arrangement arises if the two-ply carrier 2 is combined with the three-ply carrier 1. In rail 9 of the three-ply carrier 1 (FIG. 2b, power supply to the goods to be treated) the voltage drop runs in the rail from the outer edge towards the inside, i.e. rotated about 180° in relation to rail 3 in the two-ply carrier 2 (FIG. 2a). A practically complete compensation of the ohmic and inductive resistances takes place. In this case, the cell voltages are evened out in an optimal manner at the individual workpieces.

Figure 3:
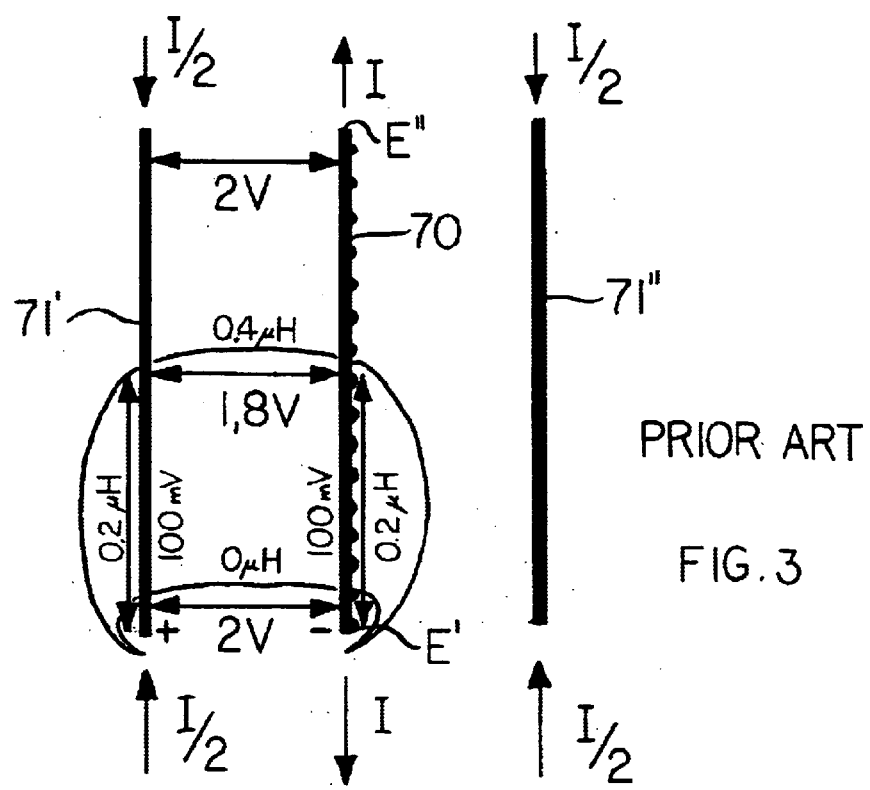
FIG. 3 a schematic representation of the voltage and inductance ratios at a carrier arrangement according to prior art.

For further explanation of the advantageous evening out of the cell voltages at the workpieces in a combination of this kind of a two-ply with a three-ply carrier, reference is made to FIGS. 3, 4, 4a and 4b:

In FIG. 3, the cell voltages on a carrier combination with conventional carriers in an electrolytic cell are represented schematically. Respectively one anode carrier 71' and 71" is disposed on each side of a cathodically polarised goods carrier 70, facing same. In this arrangement which can be counted as prior art, for the reasons explained initially, preferably respectively both ends of the goods carrier and of the anode carriers are connected to the current source. This is symbolised in the drawing by the arrows with the indication I or I/2. Respectively half the amount of the current through the goods carrier flows through the anode carrier. To estimate the voltage drops in the carriers, a voltage at the carrier ends of U=2.0 V is assumed. For the voltage drop over half a carrier arises for example a value of approximately $\Delta U=100$ mV, if simultaneously the ohmic resistance of the goods carrier per length unit is half as large as the ohmic resistance of the anode carrier per length unit. Thus the cell voltage at the workpieces secured to the ends of the goods carrier is U=2.0 V and at the workpieces secured in the centre of the goods carrier only U=1.8 V. This difference leads to considerable differences in the workpieces during electrolytic treatment.

If it is furthermore assumed that the inductance L of the carriers in typical applications is $\Delta L=0.2$ $\mu$H on a section corresponding to half the carrier length, the inductance of a circuit, which is closed by a workpiece secured roughly in the centre of the goods carrier, is $\Delta L \approx 0.4 \, \mu H$ in the carriers. The corresponding value for workpieces secured roughly to the ends of the goods carrier goes towards zero. Through these differences, the pulse rise and fall time constants are considerably influenced. Therefore for this reason, too, considerable fluctuations of the method parameters for the workpieces on a carrier arise.

Figure 4:
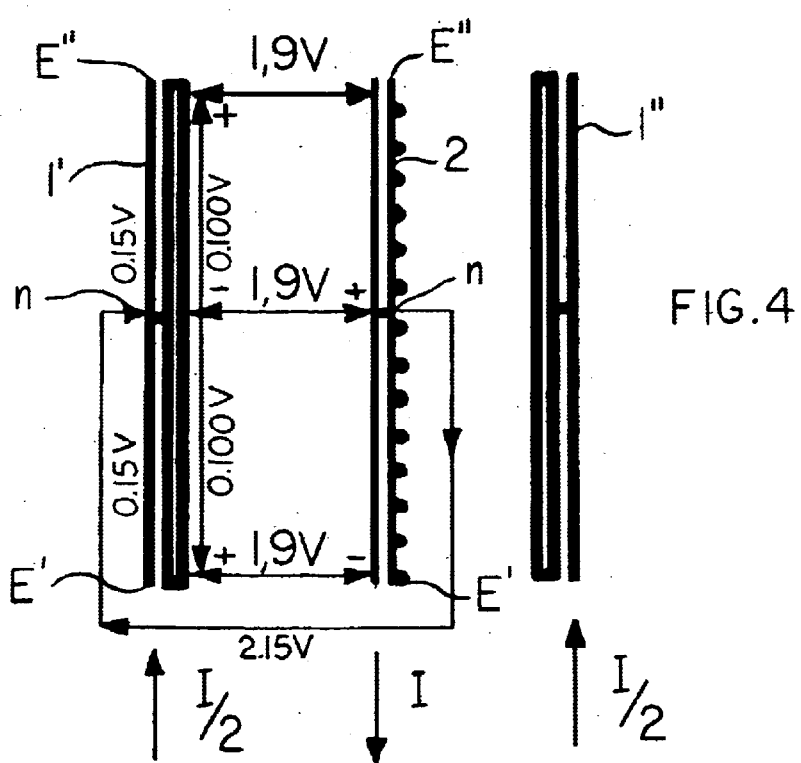
FIG. 4 a schematic representation of the voltage and inductance ratios at a carrier arrangement according to the invention.

In a combination according to the invention of a two-ply carrier 2 with two three-ply carriers 1' and 1" the ratios shown in FIG. 4 arise:

In this case too, two half cells are formed, however with a three-ply anode carrier 1', a two-ply goods carrier 2 and a further three-ply anode carrier 1". The ohmic resistances in the anode carriers and the goods carrier are again, for example, dimensioned in relation to the amount of the current flowing through in such a way that the voltage drop over a section which is half the length of a carrier is $\Delta U = 0.1$ V, a greater voltage drop ($\Delta U =$ approx. 0.15 V) occurring however in the second conductor rail of the three-ply carriers. To the carriers is applied a voltage at the level of $U = 2.15$ V in order to compensate the voltage drop in the second rail of the three-ply carrier, in such a way that the cell voltage comparable to the prior art according to FIG. 3 is effective at the level of 1.9 V.

It can be easily seen from the representation that a cell voltage at the level of $U = 1.9$ V is impressed on the workpieces secured roughly in the middle of the goods carrier 2 at M. The same is true for the workpieces secured roughly at the ends of the goods carrier at E' and E".

The same is substantially true for the inductance. To calculate the inductances, reference is made to FIG. 4a and FIG. 4b in which the inductances for individual regions of rails are given.

Figure 4A:
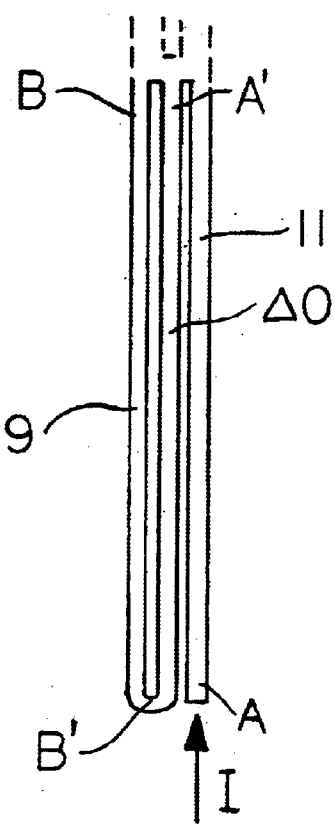
FIG. 4a a schematic representation of half a three-ply carrier.

In FIG. 4a the one half of a three-ply carrier, comprising three rails 9, 10 and 11 is represented schematically. The whole carrier is produced by reflection at a plane lying perpendicular to the longitudinal direction of the three rails at the upper bend A'. The current is supplied at one end to the third rail 11 (represented by the arrow at the location referred to as A). It is assumed that the inductances for the sections AB, AB' or AA' take the amounts $L_{AB} \approx 0.25 \, \mu H$, $L_{AB'} \approx 0.18 \, \mu H$ or $L_{AA'} \approx 0.09 \, \mu H$.

Figure 4B:
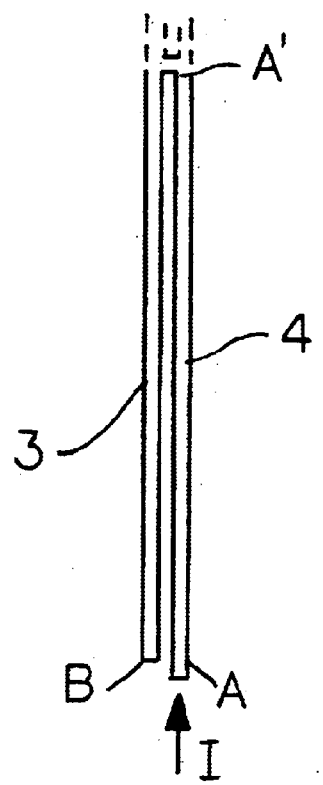
FIG. 4b a schematic representation of half a two-ply carrier.

In FIG. 4b is represented schematically the one half of a two-ply carrier, comprising the two rails 3 and 4. The whole carrier is produced by reflection at a plane lying perpendicular to the longitudinal direction of the two rails at the upper bend A'. The current is supplied at one end to the second rail 4 (represented by the arrow at the location referred to as A). It is assumed that the inductances for sections AB or AA' take the amounts $L_{AB} \approx 0.15 \, \mu H$ and $L_{AA'} \approx 0.075$ pH.

For the combination of the three-ply carrier with the two-ply carrier according to FIG. 4 there thus arise, for workpieces secured at different locations, the following values for the inductances when connected to the current source at M:

for workpieces secured at M:

$$L_1 = (0.15 + 0)\mu H = 0.15 \, \mu H$$

for workpieces secured at E':

$$L_2 = (0.075 + 0.2)\mu H = 0.275 \, \mu H$$

for workpieces secured at E":

$$L_3 = (0.075 + 0.2)\mu H = 0.275 \, \mu H$$

If, on the other hand, the current source is connected to the carriers at E', the following values arise for the inductance of the respective circuits:

for workpieces secured at M:

$$L_1 = (0.25 + 0.075)\mu H = 0.325 \, \mu H$$

for workpieces secured at E':

$$L_2 = (0.18 + 0.15)\mu H = 0.33 \, \mu H$$

for workpieces secured at E":

$$L_3 = (0.09 + 0.075 + 0.075 + 0.2)\mu H = 0.44 \, \mu H$$

The maximum difference of the effective inductances when the current is fed in at M is accordingly $\Delta L \approx 0.125 \, \mu H$ and the maximum difference when current is fed in at E' is $\Delta L \approx 0.115 \, \mu H$.

Thus whilst when conventional carriers are used for the workpieces and the anodes, a difference of the inductances for workpieces secured roughly in the centre of the goods carriers, as opposed to at the ends of the goods carriers, of $\Delta L \approx 0.4 \, \mu H$ occurs, when the carriers according to the invention are used merely a difference of $\Delta L \approx 0.125 \, \mu H$ or respectively $\Delta L \approx 0.115 \, \mu H$ develops. This smaller difference leads to clearly lower differences in the pulse rise and fall time constants at the individual workpieces, such that more even results are maintained during electroplating if the carriers according to the invention are used.

Figure 5A:
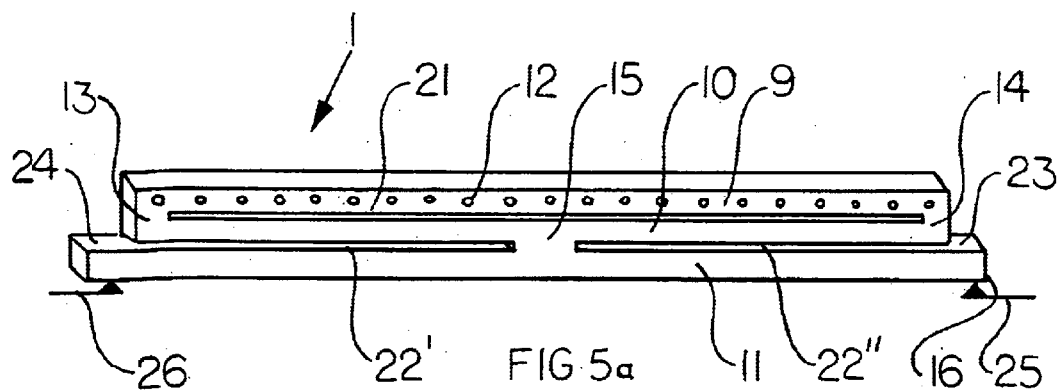
FIG. 5a a perspective view of a three-ply carrier according to the invention.
Figure 5B:
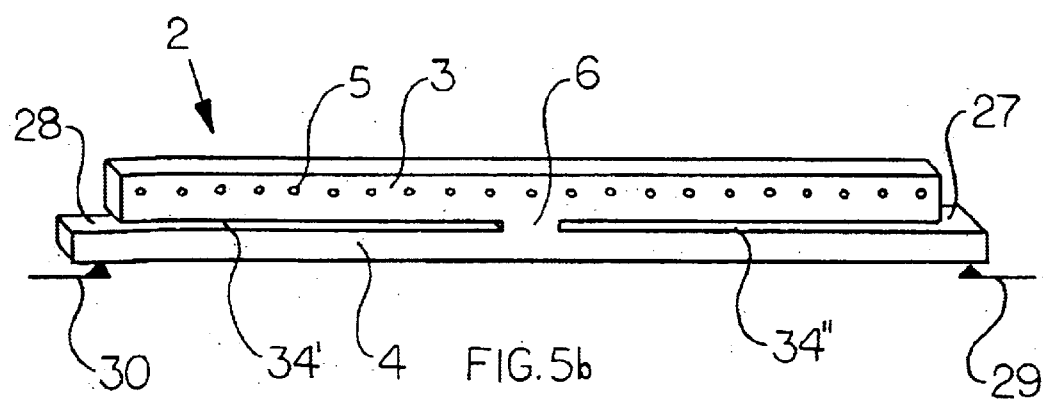
FIG. 5b a perspective view of a two-ply carrier according to the invention.

In FIG. 5a and FIG. 5b, embodiments of a three-ply carrier 1 (FIG. 5a) and a two-ply carrier 2 (FIG. 5b) are reproduced in a perspective view. The three-ply carrier in FIG. 5a, for example a goods carrier, comprises the three rails 9, 10 and 11, consisting for example of flat rails made of stainless steel. Rail 9 serves to mount the workpieces. For this purpose suitable attachment points 12 are provided. The rails are electrically connected to one another via connections 13, 14 and 15. The electrical connection 15 is preferably disposed in the centre of rails 10 and 11. This connection can however also be displaced towards the end of the two rails which is remote from the current supply location 16, for example by 25% with respect to the total length of rail 10. Apart from the electrical connections, the rails are insulated from one another. A plastics material insulating layer can here be embedded in spaces 21, 22' and 22" for this purpose. By means of an electrically insulating joining process, the carrier can be further stabilised mechanically.

Rail 11 of the three-ply carrier is configured in a preferred embodiment longer than the two other rails 9 and 10 and thus projects at the ends. The projecting ends 23 and 24 serve to deposit the carrier, for example on the edge of a treatment container on carrier receiver points 25, 26. At one of these locations (current supply location 16) an electrical contact to an external current source is provided such that the flow of current begins when the goods carrier is placed on the edge of the container.

The two-ply carrier 2 in FIG. 5b, for example an anode carrier, comprises rails 3 and 4. In this case the anode holders which carry the anodes are secured to rail 3. The corresponding attachment points are referred to by FIG. 5. In this case too the two rails consist preferably of flat-sectioned copper or stainless steel. The two rails are connected electrically to one another roughly in the middle. Between the two rails, moreover, spaces 34' and 34" are provided in which for example insulating layers formed by a plastics material film can be provided.

Rail 4 is longer than rail 3 and projects at the ends. The projecting ends 27 and 28 serve to secure the carrier 2 on the edge of a container. One of the carrier receiver points referred to by reference numerals 29, 30 serves as an electrical contact.

The two carriers 1 and 2 in FIG. 5a and FIG. 5b can be placed in the alignment shown on a container edge. In this case the rails 3 and 9 serving to secure and electrically contact the workpieces and anodes are disposed above the lengthened rails 4 and 11. The carriers can also be used in the reverse alignment, the rails carrying the workpieces and anodes hanging downwards.

Figure 6:
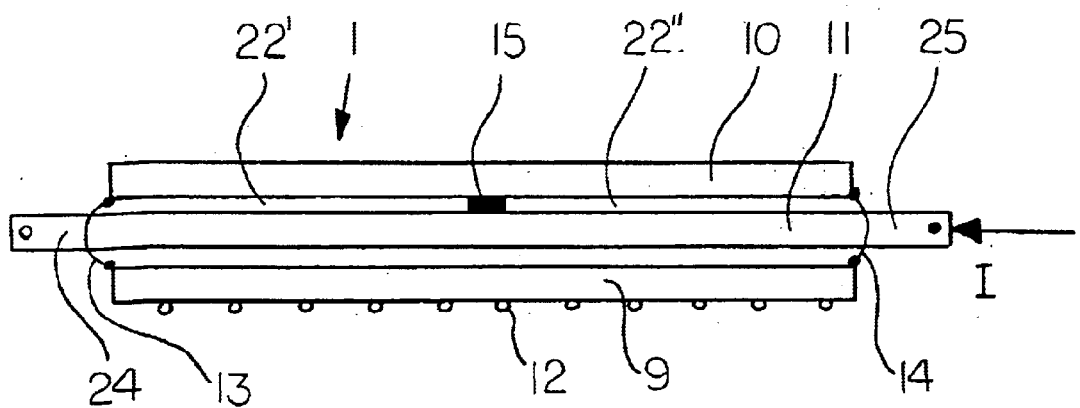
FIG. 6 a schematic representation of an embodiment of a three-ply carrier, in plan view.

An alternative embodiment of a three-ply carrier 1 is reproduced in plan view in FIG. 6. In this case rail 11, which serves as a bearing surface for the carrier on a container edge, is disposed in the centre of the two other rails 9 and 10. Thus the arrangement is balanced in its centre of gravity in a simple manner. The connections 13 and 14 formed between rails 9 and 10 bridge rail 11 in an electrically insulated manner. The current is fed into rail 11 at the location (I) indicated with the arrow. The remaining reference numerals in FIG. 6 correspond to the reference numerals quoted in FIG. 5a and FIG. 5b.

Figure 7:
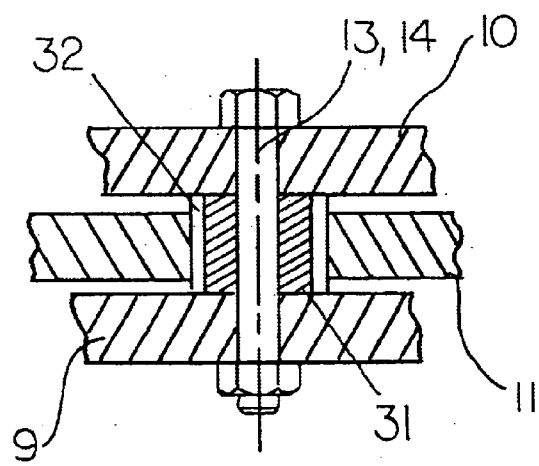
FIG. 7 a representation of an embodiment of the electrical connections 13 and 14 on the carrier shown in FIG. 6, in plan view (in section)

In order to realise the connections 13 and 14 crossing rail 11 between rails 9 and 10, the detailed solution shown in FIG. 7 is suitable, for example. This representation shows connections 13 and 14 in section. In FIG. 7 can be recognised parts of rails 9, 10 and 11. Rail 11 is flanked by rails 9 and 10. A screw connection serves as an electrical connection between rails 9 and 10. So that this electrical connection does not receive any electrical contact with rail 11, the screw connection is attached in an electrically insulated manner in rail 11. An electrically conductive distance bush 31 and an electrically insulating distance sleeve 32 serve this purpose for example. Screw connections of this kind are provided at the ends of rails 9 and 10. A plurality of screw connections can also be attached to each end.

Figure 8:
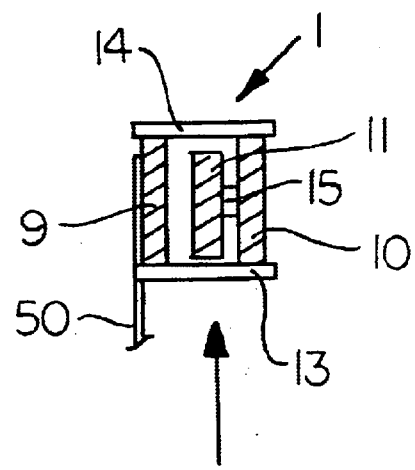
FIG. 8 a representation of another embodiment of the electrical connections 13 and 14 on the carrier shown in FIG. 6, seen from the end face.

In another embodiment according to FIG. 8 is reproduced a cross-section through a three-ply carrier 1 comprising three rails 9, 10 and 11, seen from the end face. Rail 9 serves again to mount the workpieces or anodes. In the present case, the frame rods 50 for workpieces can be recognised. Rail 10 is disposed opposite rail 9 and parallel to same. Both rails are exclusively connected at their ends to electrical connections 13 and 14 configured in the form of electrically conductive lugs. A further electrical connection 15 goes from rail 10 to rail 11, which is located between rails 9 and 10. The carrier can rest on the edge of a container with rail 11 (see arrow). Simultaneously current is supplied via the bearing surface.

Figure 9:
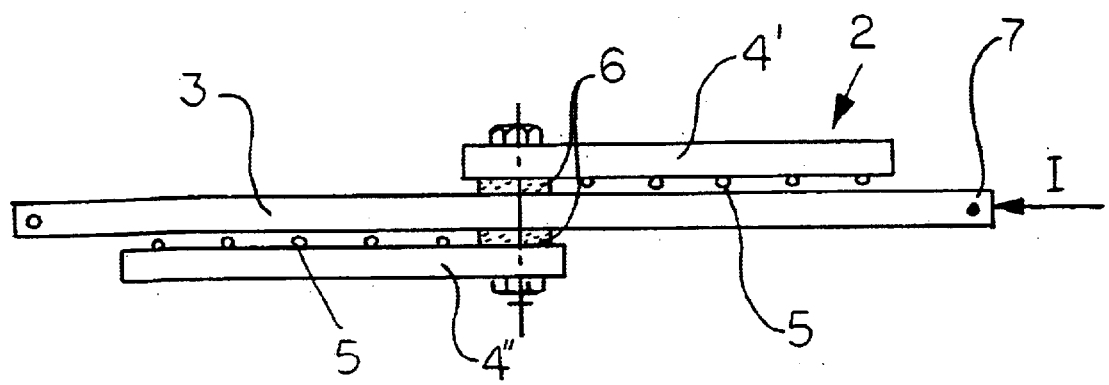
FIG. 9 a schematic representation of an embodiment for a two-ply carrier, in plan view.

In FIG. 9 is represented in plan view an embodiment of a two-ply balanced goods carrier. Rail 3 is configured so long that it can bridge the whole width of an electrolytic cell. This rail can be placed at the ends onto the edge of the treatment container. The electric current I is fed at location 7 into this rail. Two further rails 4' and 4" which merely represent a second rail displaced into itself, are electrically connected to the first rail 3 via connection 6. For this purpose serves for example a screw connection which also provides the necessary mechanical stability. To rails 4' and 4" the workpieces can be secured via the attachment points 5. Further electrically insulated connections of the rails can be attached in order to increase the mechanical stability.

Figure 10:
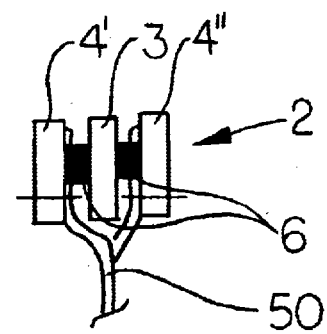
FIG. 10 a schematic representation of the attachment of frame rods for the workpieces to the carrier shown in FIG. 9, seen from the end face.

Through the lateral offset of the two rails 4' and 4" in respect of the central rail 3, the carrier is balanced. The workpieces can be secured for this purpose, for example in the manner shown in FIG. 10, to rails 4' and 4". In FIG. 10 the arrangement of FIG. 9 is reproduced, seen from the side. The frame rods 50 secured to the attachment points, for the workpieces are respectively offset towards the centre, such that the workpieces hang below the carrier 2 in the centre of gravity.

Figure 11:
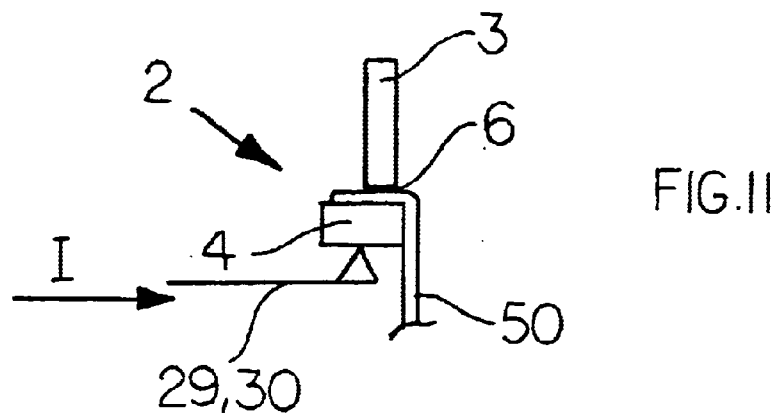
FIG. 11 a representation of the attachment of frame rods for the workpieces to a two-ply carrier, seen from the end face.

In FIG. 11 is represented a further embodiment of a two-ply goods carrier 2, seen from the end face. The rail 3 resting on the edge of the container is connected to rail 4 via a connection 6 in the centre in such a way that the latter hangs below rail 3. To rail 4 are attached in turn the frame rods 50 for workpieces. This also makes a balanced arrangement possible.

Figure 12:
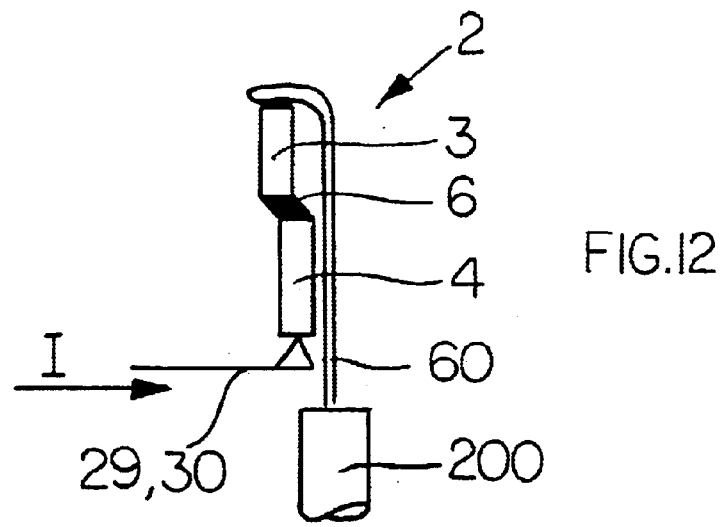
FIG. 12 a representation of an attachment of anode baskets to a two-ply carrier, seen from the end face.

In FIG. 12 is represented a further embodiment of a two-ply anode carrier 2 with rails 3 and 4, seen from the end face. The two rails are connected in the centre via the electrically conductive connection 6. Rail 4 is secured to the container edge on the receivers 29 and 30. The anode suspensions 60 rest on the upper side of rail 3. The anodes or anode baskets 200 are secured to the anode suspensions.

Figure 13:
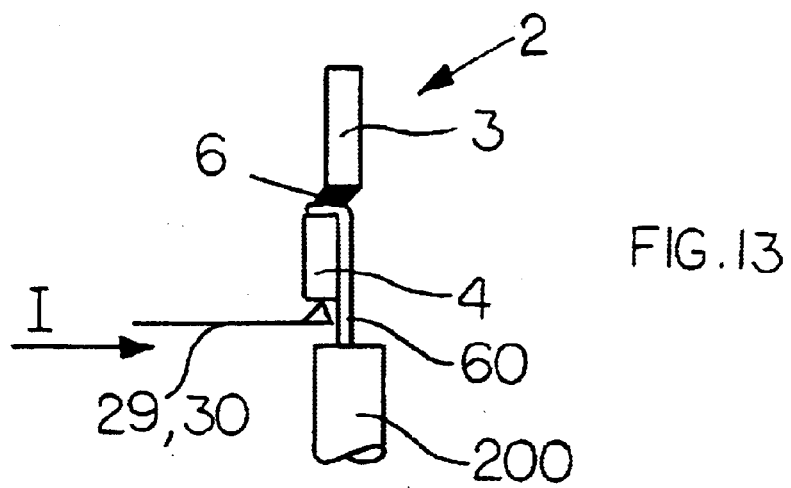
FIG. 13 a representation of an attachment of anode baskets to a two-ply carrier, seen from the end face.

In FIG. 13 is represented a further embodiment of a two-ply anode carrier 2 with rails 3 and 4, seen from the end face. The reference numerals correspond otherwise to those given in FIG. 12. Differently from the embodiment represented in FIG. 12, rail 3 is disposed above rail 4.

The above-described carriers serve to hold and electrically contact anodes or counter-electrodes switched as cathodes and to hold and electrically contact workpieces. In particular the carriers and their combinations are suitable for use in printed circuit board technology. For this purpose, the printed circuit boards are secured in known manner directly or to frames and the frames to the goods carriers according to the invention. The goods carriers are guided together with the frames and the printed circuit boards according to a pre-determined treatment pattern to the individual treatment stations and deposited on the edges of the respective treatment containers. The frames with the printed circuit boards here dip into the treatment fluid. For the electrolytic treatment of the boards, when the goods carriers are set down an electrical contact is closed at the goods carrier receivers on the edge of the container. The anode carriers are also secured to the container edge and are securely connected for supplying current or connected like a goods carrier via contacts to the power supply leads.

List of Reference Numerals

Three-ply carrier
Two-ply carrier
3,4,4',4" Rails of the two-ply carrier 2
5,5',5',5" Attachment points on the two-ply carrier 2
6 Electrical connection on the two-ply carrier 2
7 Current supply location on the two-ply carrier 2
8 Region in rail 4 through which current flows
9,10,11 Rails of the three-ply carrier 1
9',9" Rails of a four-ply carrier
12,12',12",12'" Attachment points on the three-ply carrier 1
13,14,15 Electrical connections on the three-ply carrier 1
16 Current supply location on the 3(4)-ply carrier 1
17 Region in rail 11 through which current flows
18',18" Rails of a four-ply carrier
19 Rail of a four-ply carrier
20 Rail of a four-ply carrier
21 Space between rails 9 and 10
22',22" Space between rails 10 and 11
23,24 Projecting ends on the three-ply carrier 2
25, 26 Carrier receivers on the container edge 80
27, 28 Projecting ends on the two-ply carrier 1
29, 30 Carrier receivers on the container edge 80
31 Distance bush
32 Distance sleeve
33',33" Region of rail 11 through which current flows
34',34" Spaces between rails 3 and 4
50 Frame rods for the workpieces 60 Anode suspensions
70 Conventional goods carrier
71',71'° Conventional counter-electrode carrier
80 Container edge
101,102,103,104 Printed circuit boards
105,106
200 anodes, anode baskets

What is claimed is:

1. Carrier serving to supply current to workpieces to be treated electrolytically in a dipping bath or to counter-electrodes used in the electrolytic treatment, characterized in that the carrier comprises at least three elongate electric current conductors (9–11), disposed parallel to one another, wherein
   a. a first current conductor (9) is configured in such a way that the workpieces or counter-electrodes can, for supplying electric current and for mechanical attachment, be attached to the conductor directly or via holding devices,
   b. respectively a second (10) to nth (11) current conductor is provided, the second current conductor (10) being connected to the first current conductor (9), the third current conductor (11) to the second current conductor (10) etc. via respectively at least one electrically conductive connection (13–15) in such a way that
      i. electrical transition resistances existing between connections (13, 14) between the first (9) and second (10) current conductor on the one hand and connections (15) between the (n−1)th (10) and the nth (11) current conductor on the other hand are of the same size and
      ii. the nth current conductor (11) is connected to the (n−1)th current conductor (10) via an electrically conductive connection (15) roughly in the centre of the (n−1)th current conductor (10) and
   c. electric power leads are provided from a current source at at least one end (16) of the nth current conductor (11).

2. Carrier according to claim 1, characterized in that three current conductors (9–11) are provided, the second current conductor (10) being connected to the first current conductor (9) via electrically conductive connections (13,14) roughly at the respective two ends of the first (9) and the second (10) current conductor, the third current conductor (11) being connected to the second current conductor (10) via an electrically conductive connection (15) roughly in the centre of the second current conductor (10), and electric power leads being supplied at at least one end (16) of the third current conductor (11).

3. Carrier serving to supply current to workpieces to be treated electrolytically in a dipping bath or to counter-electrodes used in the electrolytic treatment characterized in that the carrier comprises two elongate electric current conductors (3,4) disposed parallel to one another, wherein
   a. the first current conductor (3) is configured in such a way that the workpieces or counter-electrodes can, for supplying electric current and for mechanical attachment, be attached to the conductor directly or via holding devices,
   b. the second current conductor (4) is connected to the first current conductor (3) via electrically conductive connections (6) roughly in the centre of the first current conductor (3),
   c. electric power leads are provided from the current source at at least one end (7) of the second current conductor (4).

4. according to one of the preceding claims 1–3, characterized in that the current conductors (3, 4, 9–11) are configured as conductor rails formed from electrically conductive material.

5. Carrier according to claim 4, characterised in that the conductor rails (3, 4, 9–11) consist of metal.

6. Carrier according to claim 4, characterized in that a first (9), a second (10) and a third (11) conductor rail are provided.

7. Carrier according to claim 4, characterized in that the conductor rails (3, 4, 9–11) are configured in the form of flat sections, which are separated from one another in regions (21, 22', 22", 34', 34") by electrical insulating layers, in which no electrical connections (6, 13–15) are provided between the conductor rails.

8. Carrier according to claim 7, characterised in that the electrical connections (6, 13–15) are formed by a joining process.

9. Carrier according to claim 4, characterized in that the conductor rails (3, 4, 9–11) are formed by being cut to shape from a piece of electrically conductive material.

10. Carrier according to claim 4, characterized in that the conductor rails (3, 4, 9–11) are substantially of the same length and are disposed lying closely beside one another with corresponding lateral faces.

11. Carrier according to one of preceding claims 1–2 characterized in that the current conductors (9–11) are configured as conductor rails formed from electrically conductive material, and the nth conductor rail (11) is configured in such a way that it can serve the mechanical fixing of the carrier on a bath container.

12. Carrier according to claim 4, characterized in that in addition to the electrical connections (6, 13–15) between the rails (3, 4, 9–11), further electrically insulating connections are provided, by means of which the mechanical loading capacity of the carrier is increased.

13. Combination of at least one first carrier according to claim 1 with at least one second carrier according to claim 3 in an electrolytic cell.

14. Method for electrolytic treatment of workpieces, wherein
   a. the workpieces are secured to a first carrier according to one of claims 1 and 2
   b. counter-electrodes are secured to at least one second carrier, the second carrier comprising two elongate electric current conductors (3,4) disposed parallel to one another, wherein
      i. the first current conductor (3) is configured in such a way that the counter-electrodes can, for supplying electric current and for mechanical attachment, be attached to the conductor directly or via holding devices,
      ii. the second current conductor (4) is connected to the first current conductor (3) via electrically conductive connections (6) roughly in the centre of the first current conductor (3), and
      iii. electric power leads are provided from a current source at at least one end (7) of the second current conductor (4)
   c. the carriers for the workpieces and the carriers for the counter-electrodes are placed on a tank edge of a container for a treatment fluid and
   d. the workpieces and the counter-electrodes are dipped into the treatment fluid and
   e. electric current generated by a current source is led via electric power leads on the carriers to the workpieces and the counter-electrodes.

15. Method according to claim 14, characterised in that electric pulsating current is led to the workpieces and the counter-electrodes.

16. Carrier according to claim 3 characterized in that the current conductors (3, 4) are configured as conductor rails formed from electrically conductive material, and the second conductor rail (4) is configured in such a way that it can serve the mechanical fixing of the carrier on a bath container.

* * * * *

UNITED STATES PATENT AND TRADEMARK OFFICE
CERTIFICATE OF CORRECTION

PATENT NO. : 6,695,961 B1
DATED : February 24, 2004
INVENTOR(S) : Egon Hubel

It is certified that error appears in the above-identified patent and that said Letters Patent is hereby corrected as shown below:

Column 16,
Line 41, before "Three-ply carrier" insert -- 1, 1',1" --
Line 42, before "Two-ply carrier" insert -- 2 --

Column 18,
Line 1, before "according" insert -- carrier --

Signed and Sealed this

Eighteenth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,695,961 B1
DATED : February 24, 2004
INVENTOR(S) : Egon Hubel

It is certified that error appears in the above-identified patent and that said Letters Patent is hereby corrected as shown below:

Column 2,
Line 62, after "EP0" delete "1" insert -- 6 -- so it reads "EP 0 610 846 B1"

Signed and Sealed this

Twenty-fifth Day of January, 2005

JON W. DUDAS
*Director of the United States Patent and Trademark Office*